United States Patent [19]

Webster et al.

[11] 3,941,480
[45] Mar. 2, 1976

[54] WORK LOCATING SYSTEM AND METHOD WITH TEMPERATURE AND OTHER COMPENSATION CAPABILITIES

[75] Inventors: Ronald B. Webster, Melrose; Vincent J. Carulli, Warehouse Point; Kenneth O. Wood, Hebron, all of Conn.

[73] Assignee: The Gerber Scientific Instrument Company, South Windsor, Conn.

[22] Filed: Feb. 8, 1974

[21] Appl. No.: 440,740

[52] U.S. Cl............................. 356/106 R; 356/172
[51] Int. Cl.²..................... G01B 9/02; G01B 11/26
[58] Field of Search........ 356/106 R, 156, 106, 172; 33/125 T, 125 A, 1 M

[56] References Cited
UNITED STATES PATENTS

| | | | |
|---|---|---|---|
| 3,594,909 | 7/1971 | Schultz | 33/125 T |
| 3,597,091 | 8/1971 | Bowker | 356/106 R |
| 3,661,464 | 5/1972 | Hubbard | 356/106 R |

*Primary Examiner*—Alfred E. Smith
*Assistant Examiner*—Conrad J. Clark
*Attorney, Agent, or Firm*—McCormick, Paulding & Huber

[57] ABSTRACT

A work locating system having temperature and other compensation capabilities wherein the work member is mounted for controlled movement with respect to the work tool. Two sets of two laser interferometers are utilized to generate distance measuring light beams such that the beams of each set are coaxial and the beams of the respective sets are orthogonal and intersect at the work tool reference axis to thereby instantaneously and continuously determine the location of four reference points on the work member and compensate for all expansions or contractions of the work member or changes in the laser measuring system during the programmed work operation.

23 Claims, 8 Drawing Figures

3,941,480

WORK LOCATING SYSTEM AND METHOD WITH TEMPERATURE AND OTHER COMPENSATION CAPABILITIES

BACKGROUND OF THE INVENTION

This invention relates to work locating method and apparatus and more particularly to work locating apparatus and method which include provisions for instantaneous and continuous correction of work member location errors due to expansion, contraction, or meterological effects upon the apparatus or other factors.

In U.S. Pat. No. 3,622,244, a laser interferometer is used to measure the displacement of a work member but the illustrated apparatus has no provisions for correcting work member expansion or contracting during the work operation. In some prior art patents, however, compensation or ennvironmental effects is considered.

In U.S. Pat. No. 3,520,613, provisions have been made for determining the temperature of the part being positioned and repositioning that part in accordance with temperature variation so determined and other environmental factors such as atmospheric pressure and humidity. In U.S. Pat. No. 3,477,789 temperature compensation is derived from temperature dependent means and applied to the data produced by the measuring apparatus after the data is taken. Such systems depend upon the accuracy and the operability of the temperature or other sensors utilized and are subject to limitations such as the correspondence between the linearites or nonlinearites of the sensor and the system being corrected.

SUMMARY OF THE INVENTION

The invention resides in a work positioning apparatus in which a work member is mounted for motion along orthogonal X, Y coordinate axes. A work tool, such as an optical exposure head, is fixedly positioned above the work member and is operative to perform work at the intersection of the tool axis and the work member. Programmed control means are operatively connected to the work member to cause motion along the X and Y axes and to selectively position the tool axis and work member relative to one another in a continuously controlled manner. First and second reflecting members are positioned at opposite ends of the work member and at opposite sides of the tool axis. The reflecting members extend perpendicular to the X-axis and first and second interferometer means positioned relative to the work axis cooperate respectively with the first and second reflecting members to measure the relative position and change of relative position of the work member and work axis in the X-axis direction. Third and fourth reflecting members are positioned at opposite ends of the work member and extend perpendicular to the Y-axis. Third and fourth interferometer means positioned relative to the work axis cooperate with the third and fourth reflecting members to measure the relative position and change of position of the work axis and work member in the Y-coordinate direction. Means are provided for connecting the interferometer means to the control means to correct the position of the work member with respect to the optical axis in accordance with the desired programmed position.

It is a primary object of this invention to provide work locating method and apparatus which compensates for any expansion or contraction of the workpiece during the work performing operation due to temperature variation or any other cause, and which compensates for meterological effects on the laser, such as atmospheric pressure, temperature and humidity.

It is still a further object of the present invention to teach work locating method and apparatus in which correction is applied constantly and instaneously at an accuracy of one laser bit or fringe pattern.

It is still a further object of the present invention to disclose work locating method and apparatus in which two laser interferometers are located on each of two orthogonal axes intersecting the operational axis of the work tool and with each set of interferometers generating light beams which are coaxial and parallel to their respective orthogonal axes. Each set of interferometers continuously monitors the location of opposite ends or other selected reference points of the workpiece with respect to the work tool axis and are operatively connected to the workpiece control computer to instanteously and continuously correct errors of workpiece location, including those due to expansion, contraction and humidity and atmospheric pressure variations.

BRIEF DESCRIPTION OF THE DRAWINGS

FIGS. 8, 8a and 8b are showings of the invention utilizing a single laser interferometer for each measuring axis illustrating the interferometer so used on one of the two orthogonal measuring axes.

DESCRIPTION OF THE PREFERRED EMBODIMENTS

Figure 1:
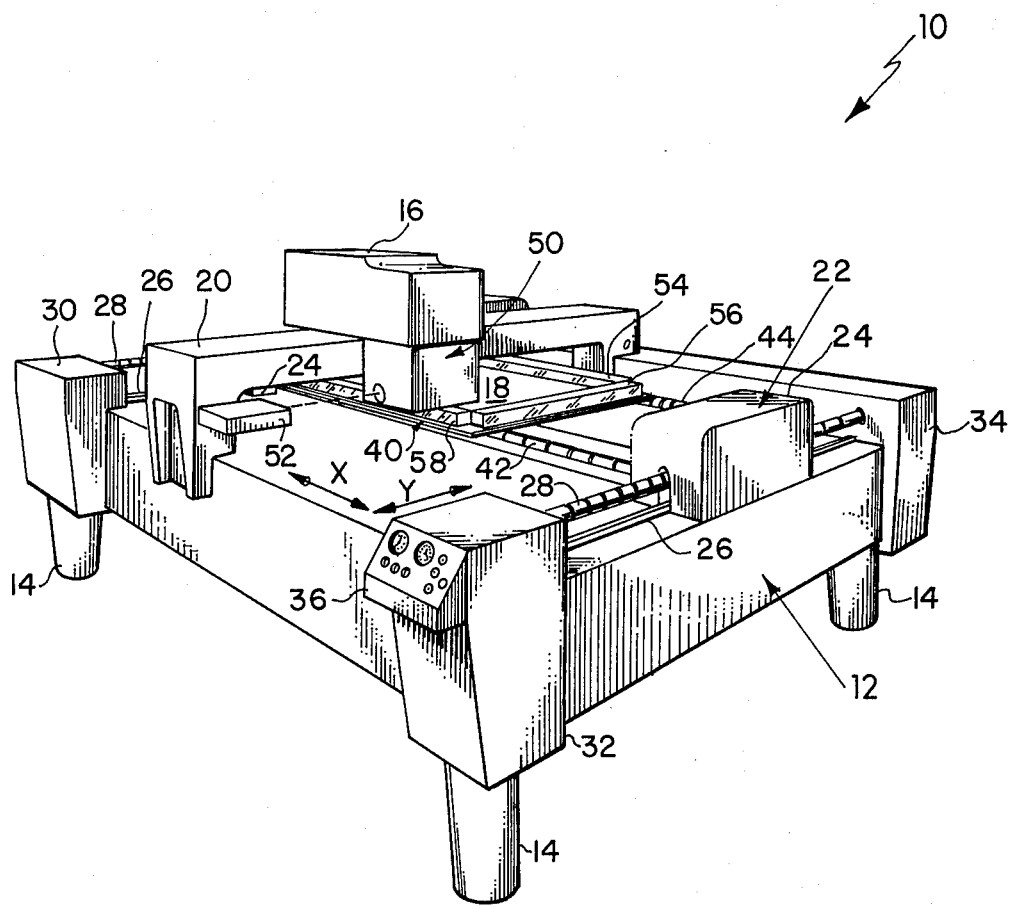
FIG. 1 is a perspective view showing a work locating device utilizing the invention.

Referring to FIG. 1 we see a work locating unit 10 which includes support table 12 positioned and supported by leg members 14 at a convenient height. A work tool 16 and a movable workpiece 18 are positioned on the table 12. Since the invention is particularly appropriate for use in devices used in fabricating printed circuits and other precise graphics, it will be described in relation to a plotter in which the work tool 16 is an optical exposure head operating a workpiece which may consist of a glass plate member having a photosensitive layer thereon. It should be borne in mind, however, that the invention is equally applicable to any device for locating a workpiece with respect to the work tool.

In the FIG. 1 structure, the work tool or optical exposure head 16 is fixedly mounted from support table 12 by support member 20, which is preferably U-shaped so that it can support the optical exposure head 16 in spaced relation vertically above table 12 and workpiece 18. Workpiece 18 is supported from table 12 for motion simultaneously with respect to orthogonal X and Y axes shown for purposes of illustration on table 12. This is accomplished by first supporting the workpiece 18 from the Y-support carriage 22 which includes housings 24 located at the opposite ends of table 12 so as to be movable back and forth on ways 26 along the Y axis in response to the action of rotating lead screws 28, to which the housings are threadably connected. The two lead screws 28 extend along the Y axis or parallel thereto and at opposite ends of table 12 to prevent lead-lag motions of one end of the carriage 22 relative to the other end and are rotatably supported at one end by support members 30 or 32 and at the other end by support member 34. A programmed computer 36 controls drive motors (not shown) in member 34 to selectively rotate the screws 28 and thereby cause Y axis carriage 22 to move back and forth along the Y axis and hence move the workpiece.

X axis carriage 40 is supported by spaced, threaded lead screws 42 and 44, which extend between housings 24 of the Y axis carriage 22 in parallel relation to the X axis and which threadably engage the X axis carriage 40 to cause motion back and forth along the X axis and hence move workpiece 18 in the X direction. Lead screws 42 and 44 are also driven by motors (not shown) in housing 24 under the control of computer 36.

Utilizing the construction shown in FIG. 1, it will therefore be seen that optical exposure head 16 is fixedly mounted from support table 12, while workpiece 18 is supported from the support table 12 and controlled by programmed computer 36 for selected planar motion along either the X axis or Y axis, or simultaneously along both axes so as to move workpiece 18 with respect to optical exposure head 16. Exposure head 16 will be performing a plotting operation upon the workpiece as it is selectively moved with respect to the head to thereby produce desired graphic information.

In view of the fact that workpiece 18 is subjected to temperature variation and atmospheric changes, such as changes in humidity and atmospheric pressure, as well as other changes some or all of which may cause contraction or expansion of the workpiece 18, or variation of the laser operation and measurements, it is an important teaching of this invention to provide work locating method and apparatus which will correct tool and workpiece location errors caused by the environmental factors.

A plurality of interferometers 50 are fixedly connected to optical exposure head 16 and derive their light source from one or more lasers 52, which are also fixedly positioned in conventional fashion on support table 12. A series of four plane mirrors, 54, 56, 58 and 60 (shown in FIG. 2) are positioned about the periphery of workpiece 18 to cooperate with laser 52 and interferometers 50 in a fashion to be described hereinafter to continuously monitor the location of the workpiece 18 and cooperate with programmed controlled computer 36 to correct all errors in the location of the workpiece caused by expansion and contraction and to also correct measurement errors caused by atmospheric changes which affect the operating characteristics of the laser 52. The mirrors 54, 56, 58 and 60 are mounted directly on the workpiece 18; however, if they were mounted instead on a carriage platform supporting the workpiece, precise correspondence between workpiece position and mirror position could be lost. Such correspondence would be preserved to a great extent if the workpiece and platform were of the same material and, hence, had the same coefficient of expansion. Compensation for workpieces and platforms which different coefficients could also be provided in the computer 36 if standard anchor points are provided on the platform.

Figure 2:
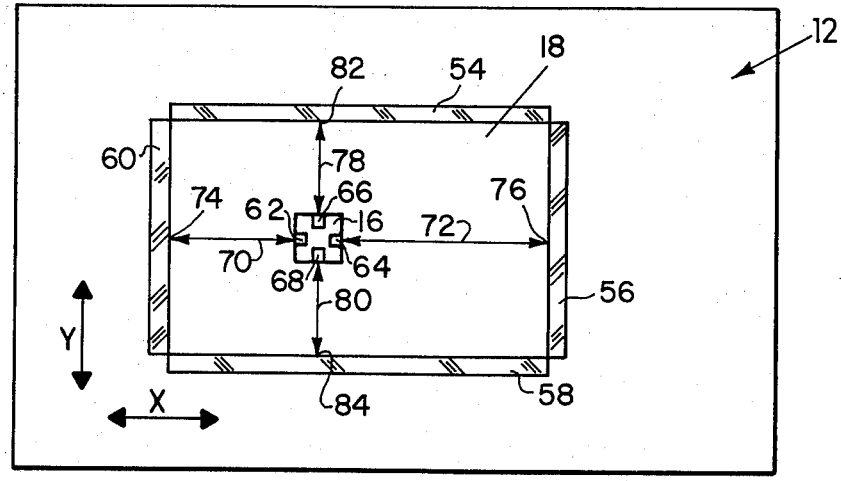
FIG. 2 is a top plan view of a work locating device using the invention in its preferred embodiment.
Figure 3:
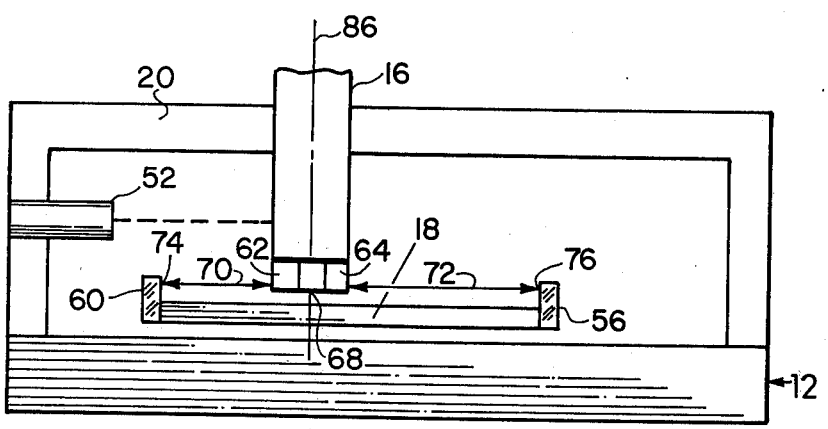
FIG. 3 is a side elevation view of the work locating device of FIG. 2 with the portions removed for purposes of illustration.

Referring to FIGS. 2 and 3 we see the preferred embodiment of the invention in which workpiece 18, in the form of a rectangular-shaped glass plate with photosensitive surface, is positioned as shown in FIG. 1 on support table 12 for computer controlled motion along orthogonal X and Y axes with respect to exposure head 16 so that the head performs selected plotting operations upon the photosensitive surface of the workpiece 18 as it is caused to move with respect to the head by the programmed computer 36. The plane mirrors 54, 56, 58 and 60 are positioned along the edges of workpiece 18 with mirrors 54 and 58 parallel to one another and the Y axis. A pair of interferometers 62 and 64, and another pair of interferometers 66 and 68, all originally identified by the numeral 50, are fixedly supported from optical exposure head 16. The interferometers 62 and 64 cooperate with one or more lasers, such as laser 52 in FIG. 3, to transmit coaxial distance-measuring light beams 70 and 72, respectively, between themselves and reflecting mirrors 60 and 56, respectively, so as to continuously provide a measurement of the location of the opposite ends 74 and 76 of workpiece 18 in the X axis direction with respect to the optical axis 86 of optical exposure head 16. Similarly, interferometers 66 and 68 cooperate with reflecting mirrors 54 and 58, respectively, to produce coaxial distance-measuring light beams 78 and 80 to continuously provide a measurement of the opposite ends 82 and 84 of workpiece 18 along the Y-axis direction with respect to the axis 86 of optical exposure head 16. Coaxial light beams 70 and 72 are orthogonal with respect to the coaxial light beams 78 and 80 and each intersects the optical axis 86 of the optical exposure head 16 so as to eliminate errors in workpiece location which would be caused by the rotation thereof with respect to the optical exposure head 16.

Figure 4:
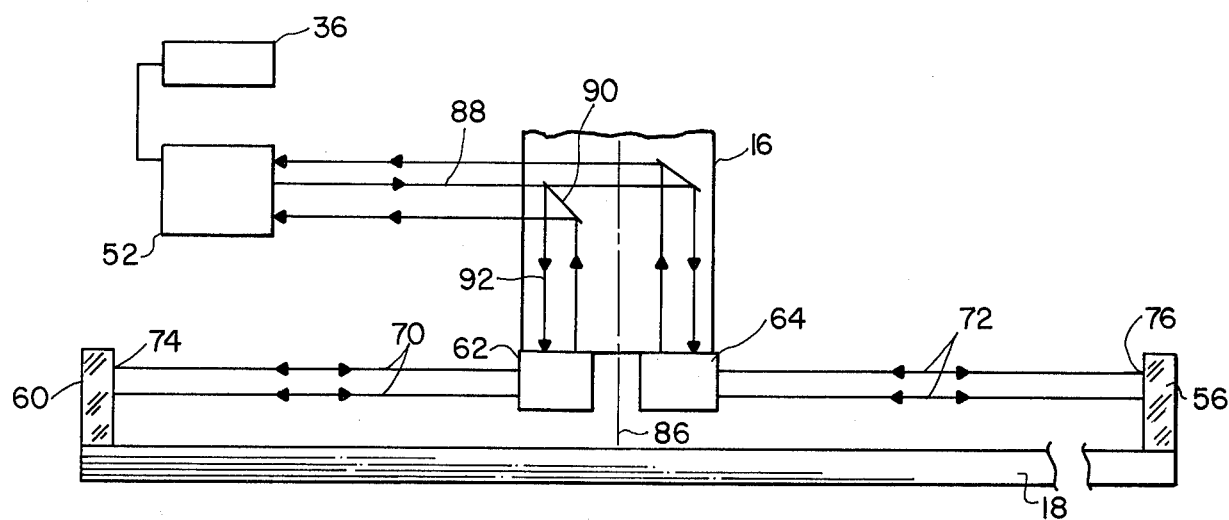
FIG. 4 is an enlarged side elevation view corresponding to FIG. 3 to permit a simplified showing of the laser-interferometer system on one of the two orthogonal measuring axes.

Referring to FIG. 4, we see a view similar to FIG. 3 but illustrating in simplified form the optical cooperation between laser 52, optical exposure head 16, interferometers 62 and 64 and reflecting mirrors 56 and 60. FIG. 4 illustrates the operation of the work locating apparatus along the X-measuring axis parallel to the coaxial light beams 70 and 72. As shown in FIG. 4, laser 52 emits a light beam 88, a portion of which may be reflected by a beam splitter 90 to proceed along line 92 to the interferometer 62. The interferometer 62 directs the beam back and forth to the plane mirror 60 twice and then back to a detector in the laser 52. Although a double measuring beam 70 is produced between the interferometer 62 and mirror 60, laser systems producing a single measuring beam can also be utilized. The data obtained by the measuring beam 70 provides a continuous measurement of the location of one of the ends of workpiece 18, specifically station 74, with respect to optical axis 86 in the X-axis direction. This measurement will be continuously fed to computer 36 to be compared with a programmed location of the station 74, or conversely the workpoint at the intersection of axis 86 and the workpiece, at the instant in time. Computer 36 will correct the location of workpiece 18 if error is so determined.

Laser 52 as illustrated, or a second comparable laser unit, provides the light beam for the interferometer 64 which produces the doubled measuring beam 72 and in a similar manner cooperates with plane mirror 56 to continuously provide a measurement of the location of the opposite end of workpiece 18, specifically station 76, with respect to the optical axis 86 along the X axis. This measurement is also provided to the computer 36 for error detection and correction.

It should be understood that the FIG. 4 construction is overly simplified for purposes of illustration but serves to detect instanteously and continuously the location of the opposite ends of workpiece 18 at stations 74 and 76 with respect to the optical exposure head 16. Any departure from a programmed location at any instant in time is corrected by the computer 36. A system similar to that shown in FIG. 4 is also used to detect the location of the work member 18 at its opposite ends along the Y axis and in particular, at stations 82 and 84. Similar correction of any detected error is also made by the computer 36.

The operation of lasers, computers and interferometers is well known and the components illustrated and described herein are overly simplified in form since they operate in conventional fashion when used in part of this invention. A more detailed description of this equipment and its operation may be obtained by referring to any of the following publications:

Optics by Smith and Thompson, published by John Wiley & Sons,

Progress in Optics, Volume VI by Wolf, published by North-Holland Publishing Company of Amsterdam, Optical Interferometry by Francon, published by Academic Press of New York and London, Page 930 of Van Nostrand's Scientific Encyclopedia, Fourth Edition, Published by D. Van Nostrand Company, Inc. of Princeton, New Jersey, Principles of Optics by Born and Wolf, Fourth Revised Edition, 1970, published by Pergamar Press, and A publication of the Hewlett Packard Company, entitled "5526A Laser Measurement System." It will be evident to those skilled in the art that the interferometer-mirror combinations disclosed in FIGS. 2–4, may well be the plane mirror interferometer shown in page 19 of the last mentioned publication.

Figure 5:
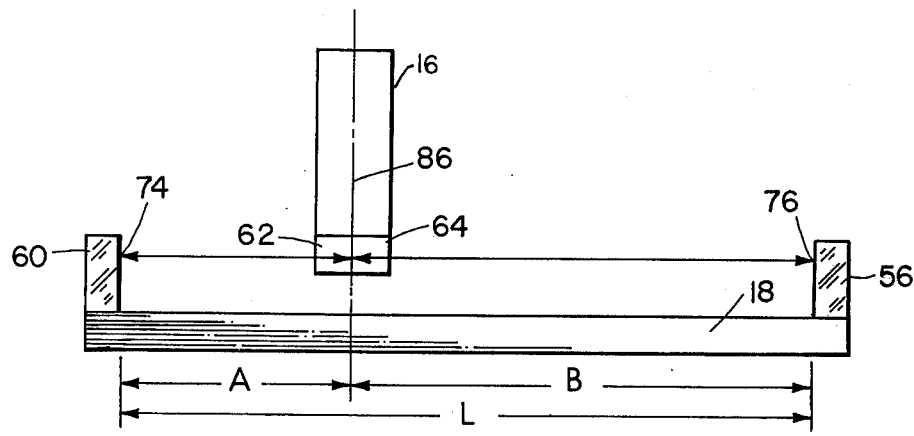
FIG. 5 is an enlarged side view of a work locating device utilizing the invention and illustrating the workpiece dimensions to permit an analytical description of the operation of the invention.

The significance of the laser interferometer arrangement as shown in FIG. 4 will be best appreciated by viewing FIG. 5 where the arrangement is analytically explained.

Referring to FIG. 5 we see workpiece 18 in a view comparable to FIG. 4, that is, along the X axis associated with the coaxial measuring beams 70, 72 of FIG. 2. Consider that the workpiece length L at the initial plotting conditions, namely temperature, pressure and humidity, is known, that a distance A between the optical axis 86 of the exposure head 16 and one end of workpiece 18 at station 74 is known and established at initial conditions and that, therefore, a corresponding distance B between the optical axis 86 and the opposite end of workpiece 18 at station 76 is known. Of course, the distances A and B change for each programmed position of the workpiece. For simplicity it is assumed that the A and B distances or changes in these distances are measured from the optical axis 86 when in fact compensation for the relatively fixed offsets of the axis and interferometers would be made.

We establish as our first equation:

$$L = A + B \qquad (1)$$

at each location of the work tool axis 86 relative to mirrors 60 and 56 at the opposite ends of the workpiece 18. Any dimensional change in the workpiece due to temperature or other factors, or any operational change in the laser 52 due to meterological effects or other operational and dimensional changes due to other causes will be reflected in the measurements from the interferometers.

Assuming that, due to workpiece expansion or contraction, the workpiece length changes to dimension $L_1$, we can then set up the following equations:

$$L_1 = A_1 + B_1 \qquad (2)$$

where $A_1$ = the new measured distance along the X axis between the optical axis 86 and the station 74, and $B_1$ = the new measured distance along the X axis between the axis 86 and the station 76.

If the expansion or contraction of the workpiece is considered to be uniform throughout, then the following equations are true:

$$\frac{A}{B} = C \qquad (3)$$

$$\frac{A_1}{B_1} = C \qquad (4)$$

Solving for $B_1$ in equation (4) and substituting in equation (2) produces $$L_1 = A_1 + \frac{A_1}{C}.$$

Solving for $A_1$ establishes $$A_1 = \frac{L_1 C}{1 + C}. \qquad (5)$$

Since C is known from the initial ratio A/B and since $L_1$ is known or can be determined from the new workpiece dimensions measured by the laser system, $A_1$ can be determined from equation (5) by the computer 36 to control the positioning servos and establish the correct dimension between the optical axis 86 and the reference station 74 at the mirror 60. The corresponding dimension $B_1$ automatically follows by virtue of the definition given in equation (2). Effectively, the laser measuring system shown in FIG. 5 permits the positioning servos to maintain the constant ratios shown in equations (3) and (4) regardless of the contraction or expansion experienced by the workpiece.

It will also be observed that other ambient conditions such as atmospheric pressure and humidity which effect the laser itself cause proportional changes in the measured distances A and B. However, the maintenance of a constant ratio of the measured distances by the computer 36 in the absence of other positioning commands holds the same relative positioning of the optical axis 86 and the workpiece so that the point on the workpiece intersected by the axis does not move relative the workpiece surface.

Figure 6:
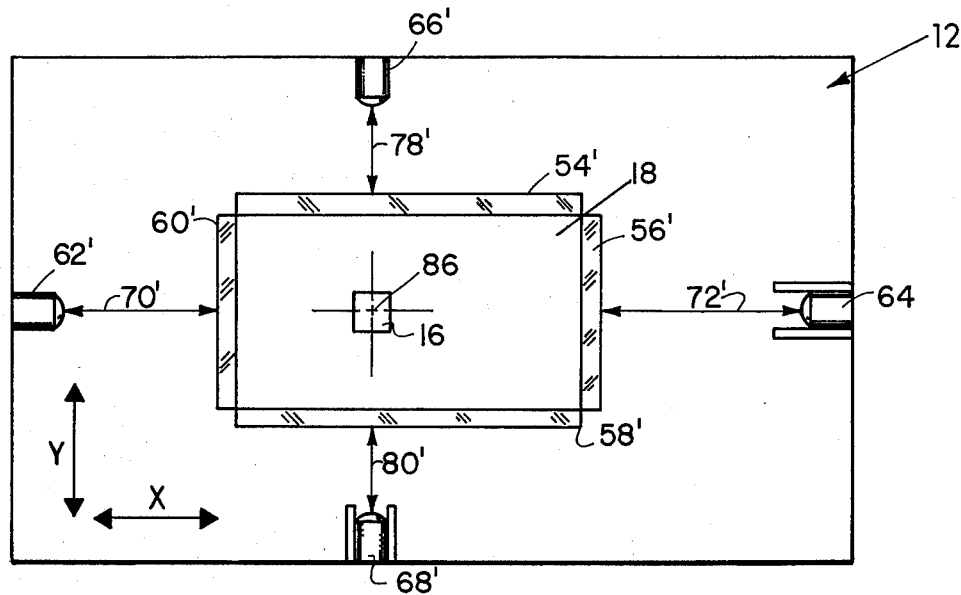
FIG. 6 is a top view of a work locating apparatus using a modification of the invention.
Figure 7:
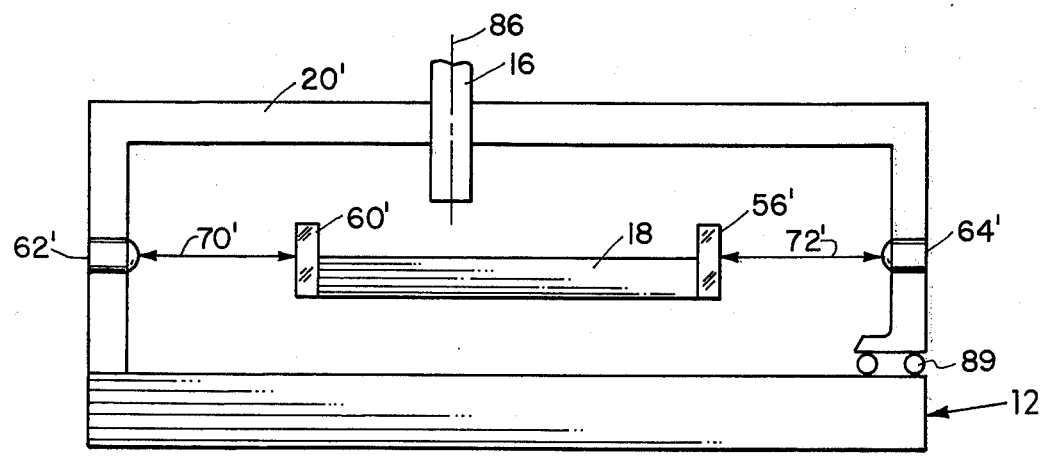
FIG. 7 is a side view of the FIG. 6 modification of the invention, with portions removed for purposes of illustration.

Referring to FIGS. 6 and 7, we see another embodiment of the invention in which workpiece 18 is similarly supported by support table 12 as shown in FIG. 1 with outwardly facing plane mirrors 54', 56', 58' and 60' positioned on the periphery of the workpiece. In this configuration the interferometers 62' and 64' are located beyond opposite ends of workpiece 18 so as to cooperate with plane mirrors 60' and 56', respectively, to generate coaxial light beams 70' and 72', which when projected intersect optical axis 86 of optical exposure head 16. Similarly, interferometers 66' and 68' are located on opposite sides an outwardly of workpiece 18 so as to cooperate with outwardly facing plane mirrors 54' and 58' to produce coaxial light beams 78' and 80' which are orthogonal with respect to coaxial beams 70' and 72' and also intersect axis 86 of optical exposure head 16.

Other than the location of the interferometers externally of the workpiece 18 and the reversed positions of the plane mirrors, the FIGS. 6 and 7 construction operates similarly to the preferred construction of FIGS. 2 and 3. As best shown in FIG. 7, optical exposure head 16 is supported from the support structure 20', which also serves to support interferometers 62' and 64', and which in turn is supported by the table 12. Interferometers 66' and 68' are fixedly positioned by independent support means (not shown). It may be desirable to provide an expandable joint 89 between support member 20' and the support table 12 to permit relative motion.

Figure 8:
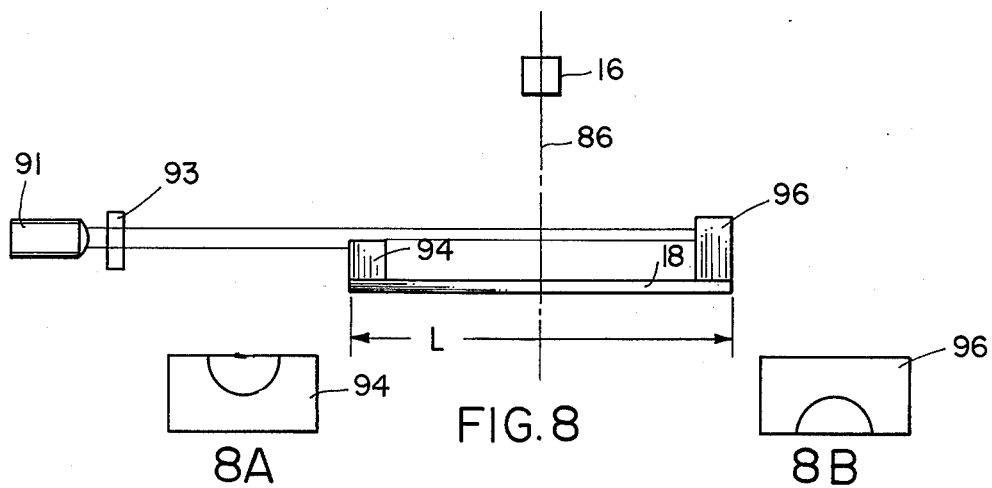

The FIGS. 8, 8a and 8b illustrate an embodiment of the invention in which a single laser unit 91 only is used on each of the orthogonal measuring axes previously described. In the FIG. 8 construction, the light beam from the laser 91 is directed to interferometer 93 for one of the measuring axes and is then divided into two parts with half of the beam so divided being reflected by plane mirror 94 as shown in FIG. 8a, located at one end of workpiece 18 and returned to a first photocell in the laser 91, while the other half of the divided beam is reflected from mirror 96, as shown in FIG. 8b, at the opposite end of workpiece 18, and returned to a second photocell in laser 91. An arrangement similar to the FIG. 8 construction would also be used for the orthogonal measuring axis. Accordingly, single interferometers are used to determine workpiece location and expansion and contraction along each of the orthogonal measuring axes.

Although the present invention has been described in several embodiments, it will be understood that numerous modifications and substitutions can be had in each embodiment without departing from the spirit of the invention. For example, although the positioning apparatus has been disclosed in conjunction with an optical exposure head and workpiece which are moved relative to one another by virtue of carriages associated respectively with orthogonal X and Y axes, the invention can also be employed in a plotting system in which the relative movements are generated by virtue of carriages which move in accordance with a polar coordinate system. In such a system, a circular mirror on a rotatable workpiece cooperates with pairs of interferometers on the tool head in the same manner as described above, to maintain a constant ratio of the A and B measurements affected by ambient conditions. Accordingly, the present invention has been described in several forms by way of illustration rather than limitation.

We claim:

1. Work positioning apparatus comprising:
    a work member mounted for motion along orthogonal X and Y axes;
    a tool head fixedly positioned above said work member and operative to perform work thereon, and having a tool axis intersecting said work member;
    control means operatively connected to said work member and programmed to cause motion thereof along said X and Y axes to selectively position the work member with respect to said tool axis in accordance with pre-determined ratios of distances along the respective axes between the tool axis and the ends of the work member and thereby continuously control the work being done on the work member by the head;
    first and second reflecting members positioned at opposite ends of said work member in spaced relation to said tool axis and on opposite sides thereof and extending perpendicular to the X axis;
    first interferometer means fixedly positioned relative to said tool axis and oriented to project a first light beam along a measuring axis which is parallel to said X axis and intercepts said tool axis, the first light beam being reflected by said first reflecting member to thereby measure the position, and change of position of the first X-axis end of the work member relative to said tool axis;
    second interferometer means fixedly positioned relative to said tool axis and oriented to project a second light beam along a measuring axis intercepting said tool axis and coaxial with the measuring axis of said first interferometer means, the second light beam being reflected by said second reflecting member to thereby measure the position, and change of position of the second X-axis end of the work member relative to said tool axis;
    third and fourth reflecting members positioned at opposite ends of said work member in spaced relation to said tool axis and on opposite sides thereof and extending perpendicular to the y axis;
    third interferometer means fixedly positioned relative to said tool axis and oriented to project a third light beam along a measuring axis which is parallel to the Y axis and intercepts said tool axis, the third light beam being reflected by said third reflecting member to thereby measure the position, and change of position of the first Y-axis end of the work member from the tool axis;
    fourth interferometer means fixedly positioned relative to said tool axis and oriented to project a fourth light beam along a measuring axis intercepting the tool axis and coaxial with the measuring axis of said third interferometer means, the fourth light beam being reflected by said fourth reflecting member to thereby measure the position, and change of position of the second Y-axis end of said work member relative to the tool axis, and
    means connecting said interferometer means to said control means to correctly position said work member with respect to the tool axis at the programmed positions.

2. Work positioning apparatus according to claim 1 wherein said interferometers means are fixedly positioned outwardly beyond the boundaries of said work member.

3. Work positioning apparatus according to claim 1 wherein said interferometer means are fixedly positioned near or attached to said tool head.

4. Work positioning means according to claim 3 wherein said work member is flat.

5. Work positioning means according to claim 4 wherein said work member is of rectangular shape and said reflecting members are plane mirrors.

6. Work positioning apparatus according to claim 5 wherein said work member is mounted for motion in a single plane.

7. Work positioning apparatus comprising:
a work member mounted for motion along orthogonal X and Y axes;
an optical exposure head fixedly positioned above said work member and operative to perform work thereon, and having an optical axis intersecting the work member;
control means operatively connected to said work member to cause programmed motion thereof along said X and Y axes to selectively position the work member with respect to the optical exposure head and thereby continuously control the work being done on said work member by said optical exposure head;
interferometry means operative to generate light beams travelling between said optical exposure head and stations on the ends of said work member located at opposite ends of orthogonal measuring axes intersecting said optical axis to continuously determine the position and change of position of said work member ends with respect to said optical exposure head, the interferometry means including;
two sets of two plane mirror interferometers fixedly positioned at said optical exposure head, each set located on each of the orthogonal measuring axes intersecting the optical axis;
mirror means cooperating with the sets of interferometers and positioned on opposite ends of said work member;
at least one laser unit including detectors fixedly positioned to emit a laser light beam to each of said interferometers for reflection therefrom along the measuring axes to the associated mirror means and back therefrom and to said interferometer unit to determine changes in the location of the respective work member ends; and
means to transmit work member position signals to said control means to correctively position said work member in accordance with a programmed ratio of distances between the work member ends and the optical axis.

8. Work positioning apparatus comprising:
a work member mounted for motion along orthogonal X and y axes;
an optical exposure head fixedly positioned above said work member and operative to perform work thereon, and having an optical axis intersecting the work member and the orthogonal axes;
control means operatively connected to said work member to cause motion thereof along said X and Y axes to selectively position the work member with respect to the optical exposure head in predetermined ratios of distances between the optical axis and the sides of the work member and thereby continuously control the work being done on the work member by the optical exposure head; and
interferometry means connected with the control means and including;

a. a plurality of interferometers positioned outwardly of and on opposite sides of said work member on each of the two orthogonal axes intersecting the optical axis,
b. mirror means cooperating with the interferometers and positioned on each of the sides of said work member, and
c. at least one laser-detector unit fixedly positioned to emit a laser light beam to each of said interferometers for reflection therefrom along the orthogonal axes to the associated mirror means and back to said interferometers and the laser detector unit to determine changes in the location of the associated work member sides.

9. Apparatus according to claim 8 and including means to transmit corrective signals from said laser-detector unit to said control means to correct the position of said work member.

10. The method of continuously correcting the position of a work member caused by temperature and other environmental factors affecting the work member position measurements comprising the steps of:
mounting the work member for selected planar motion,
positioning a tool which is operative to perform work on a work member in position with respect to the work member so that an axis of the tool intersects the work member;
moving the work member and the tool relative to one another so as to produce the desired work upon the work member;
determining the relative position of the work member and the tool axis by mounting optical interferometer means to generate light beams intersecting the tool axis and extending between the tool and the opposite ends of the work member to continuously and separately determine both of the relative distances of the respective work member ends from the tool axis; and
continuously repositioning the work member and the tool relative to one another in accordance with ratio of the relative distances determined by the interferometer means.

11. The method according to claim 10 wherein said work member is flat and of rectangular shape, wherein said optical interferometer means includes two interferometers fixedly mounted adjacent said tool and two corresponding plane reflecting mirrors positioned at the opposite ends of the work member.

12. The method according to claim 10 wherein said work member is flat and of rectangular shape and wherein said optical interferometer means includes two plane reflecting mirrors positioned at the opposite ends of the work member perpendicular to the light beams and wherein two interferometers are positioned fixedly outwardly beyond the periphery of the work member on opposite sides thereof to direct said light beams between the associated plane mirrors and interferometers.

13. The method of positioning a work member during the work process including the steps of:
mounting the work member for simultaneous motion along orthogonal X and Y axes;
fixedly positioning a work tool having a reference axis in operative position to do work upon said work member;
providing programmed control means to move the work member with respect to the work tool in accordance with specified ratios of distances between the work tool reference axis and the ends of the work member to selectively accomplish the desired work on the work member;

mounting two interferometer members on each of two orthogonal axes of the work member which axes intersect at the work tool reference axis so that each set of interferometer members produce measuring light beams parallel with the axis on which they are located and so that the interferometer members instantaneously and continuously determine the location and change of location of each of the four ends of the work member with respect to the tool reference axis;

causing said work member to follow programmed movement with respect to said work tool reference axis in response to control means authority;

continuously monitoring the distances of the four work member ends relative to the work tool reference axis by means of the interferometer members;

continuously comparing the distances of the work member ends so determined with the programmed ratios for the distances for that instant in time to determine position errors; and sending corrective signals to the control means to correctively position the work member with respect to the work tool reference axis.

14. The method according to claim 13 wherein the work member is flat and of rectangular shape and wherein the interferometer members include four interferometers fixedly mounted on the work tool and four plane mirrors positioned about the periphery of the work member so that the four interferometers and mirrors respectively reflect measuring light beams therebetween along the two orthogonal axes intersecting the work tool reference axis.

15. The method according to claim 13 wherein said work member is flat and of rectangular shape and wherein the interferometer members include plane mirrors positioned about the periphery of the work member and two interferometers positioned outwardly of the work member and on opposite sides thereof on each of the orthogonal axes so that the interferometers on each orthogonal axis and their associated mirrors generate measuring light beams and so that the light beams so generated by both interferometer sets on each orthogonal axis produce measuring light beams which are orthogonal and which intersect the work at a reference axis.

16. Work positioning apparatus including:
a work member;
a work tool fixedly positioned above said work member and operative to perform work thereon, and having a reference axis intersecting said work member;
control means operatively connected to said work tool and member and programmed to cause relative motion of the work member and work tool to selectively position the work member with respect to the reference axis of said work tool along a coordinate axis and thereby continuously control the work being done on the work member by the work tool;
first reflecting means positioned at selected first and second reference stations on said work member in spaced relation to said reference axis and on opposite sides thereof;

first interferometer means positioned on the same side of said reference axis as said first reference station and oriented to project a measuring light beam parallel to the coordinate axis intersecting said reference axis and toward the first reference station to be reflected by said first reflecting means at the first station to thereby measure the position, and change of position of the first reference station of the work member with respect to said reference axis;

second interferometer means positioned on the same side of said reference axis as said second reference station and oriented to project a measuring light beam parallel to the coordinate axis intersecting said reference axis and toward the second reference station to be reflected by said first reflecting means at the second reference station too thereby measure the position, and change of position of the second reference station of the work member with respect to said reference axis;

means to continuously compare the position measurements of said reference stations so measured to their programmed positions to determine work member position error; and means connected to said control means to transmit position errors thereto to thereby correct the position of said work member with respect to the reference axis and to maintain the ratio of the measured positions of the reference stations with respect to the reference axis the same as the programmed positions along the corresponding coordinate axis.

17. Work positioning apparatus as defined in claim 16 further including:
second reflecting means positioned along another coordinate axis at third and fourth reference stations on said work member in spaced relation to said reference axis and on opposite sides thereof;
third interferometer means positioned on the same side of said reference axis as said third reference station and oriented to project a measuring light beam parallel to the other coordinate axis intersecting said reference axis toward the third reference station to be reflected by said second reflecting means to thereby measure the position, and change of position of the third reference station of the work member with respect to the reference axis; and
fourth interferometer means positioned on the same side of said reference axis as said fourth reference station and oriented to project a measuring light beam parallel to the other coordinate axis intersecting said reference axis toward the fourth reference station to be reflected by said second reflecting means to thereby measure the position, and change of position of the fourth reference station of said work member with respect to the reference axis.

18. Work positioning apparatus as defined in claim 16 wherein:
the first reflecting means comprises a first mirror mounted on the work member perpendicular to the coordinate axis at the first reference station; and a second mirror mounted on the work member perpendicular to the coordinate axis at the second reference station.

19. A work position measuring apparatus for moving a work tool and a work member worked upon by the tool relative to one another in a direction perpendicular to an axis of the tool extending toward the work member in accordance with a work program comprising:

first measuring means located along a coordinate axis parallel to said direction perpendicular to the tool axis for measuring the distance or change of distance between the tool and a first edge of the work member along the coordinate axis;

second measuring means located along the coordinate axis for measuring the distance or change of distance along the coordinate axis between the tool and a second edge of the work member at the opposite side of the tool axis from the first edge; and control means connected to move the work member and tool relative to one another to maintain the ratio of the measured distances between the tool and the edges the same as the ratio of the corresponding distances defined by the work program.

20. A work position measuring apparatus as defined in claim 19 wherein:

the first measuring means comprises an interferometer and a cooperating reflector positioned to project a measuring light beam between the tool and the first edge of the work member; and the second measuring means also comprises an interferometer and a reflector positioned to project a measuring beam between the tool and the second edge of the work member.

21. A work position measuring apparatus as defined in claim 20 wherein the reflectors of the first and second measuring means are mounted on the work member at the first and second edges respectively.

22. A work position measuring apparatus as defined in claim 21 wherein:

the interferometer of the first measuring means is mounted adjacent the tool between the tool axis and the reflector of the first measuring means; and the interferometer of the second measuring means is mounted adjacent the tool between the tool axis and the reflector of the second measuring means.

23. A work position measuring apparatus as defined in claim 21 wherein:

the interferometer of the first measuring means is mounted at a side reflector of the first measuring means opposite the tool axis; and the interferometer of the second measuring means is mounted at a side of the reflector of the second measuring means opposite the tool axis.

* * * * *